United States Patent
Lhee et al.

(10) Patent No.: US 9,536,936 B2
(45) Date of Patent: Jan. 3, 2017

(54) ORGANIC LIGHT EMITTING DIODE DISPLAY

(75) Inventors: Zail Lhee, Yongin (KR); Ji-Yeon Baek, Yongin (KR); Seung-Yo Yang, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 372 days.

(21) Appl. No.: 12/929,390

(22) Filed: Jan. 20, 2011

(65) Prior Publication Data

US 2011/0175094 A1 Jul. 21, 2011

(30) Foreign Application Priority Data

Jan. 21, 2010 (KR) ........................ 10-2010-0005546

(51) Int. Cl.
*H01L 29/00* (2006.01)
*H01L 27/32* (2006.01)
*H01L 51/52* (2006.01)

(52) U.S. Cl.
CPC ....... *H01L 27/3276* (2013.01); *H01L 51/5246* (2013.01)

(58) Field of Classification Search
CPC .............. H01L 27/3276; H01L 51/524; H01L 51/5246; G02F 1/136204; G02F 2202/22; G09G 2330/04
USPC 257/59, 72, E51.005; 438/149, 151; 349/40, 139, 147, 153, 190
See application file for complete search history.

(56) References Cited

U.S. PATENT DOCUMENTS

| | | | | |
|---|---|---|---|---|
| 5,982,470 A | * | 11/1999 | Nakahara | G02F 1/1345 349/139 |
| 6,201,590 B1 | * | 3/2001 | Ohta | G02F 1/133512 349/111 |
| 6,549,259 B2 | * | 4/2003 | Sato et al. | 349/153 |
| 7,279,708 B2 | * | 10/2007 | Kwak et al. | 257/59 |
| 7,583,347 B2 | * | 9/2009 | Shiota | G02F 1/133512 349/114 |
| 7,816,693 B2 | * | 10/2010 | Inoue et al. | 257/88 |
| 2005/0231107 A1 | * | 10/2005 | Yamazaki | H01L 27/3276 313/506 |

FOREIGN PATENT DOCUMENTS

| | | |
|---|---|---|
| JP | 2004-030974 A | 1/2004 |
| KR | 10-2005-0090259 A | 9/2005 |
| KR | 10-2007-0083124 A | 8/2007 |
| KR | 10 2008-0109657 A | 12/2008 |

* cited by examiner

*Primary Examiner* — Kenneth Parker
*Assistant Examiner* — John Lin
(74) *Attorney, Agent, or Firm* — Lee & Morse, P.C.

(57) ABSTRACT

An organic light emitting diode display includes a display substrate, a sealing member disposed to face the display substrate, a sealant disposed between the display substrate and the sealing member, the sealant being configured to attach the display substrate and the sealing member to each other, a plurality of conductive wires on the display substrate, the conductive wires overlapping the sealant, and at least one short-circuit blocking layer between the conductive wires.

15 Claims, 10 Drawing Sheets

ORGANIC LIGHT EMITTING DIODE DISPLAY

BACKGROUND

1. Field

The described technology relates generally to an organic light emitting diode display.

2. Description of the Related Art

In general, an organic light emitting diode display includes a display substrate having an organic light emitting diode, a sealing member disposed to face the display substrate and to protect the organic light emitting diode of the display substrate, and a sealant attaching and sealing the display substrate and the sealing member to each other.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode display, which substantially overcomes one or more of the problems due to the limitations and disadvantages of the related art.

It is therefore a feature of an embodiment to provide an organic light emitting diode display having a structure capable of improving the durability of conductive wires overlapping with a sealant.

It is therefore another feature of an embodiment to provide an organic light emitting diode display having a structure capable of effectively preventing moisture from permeating into a sealant.

At least one of the above and other features and advantages may be realized by providing an organic light emitting diode display that includes a display substrate, a sealing member disposed to face the display substrate, a sealant disposed between the display substrate and the sealing member to attach the display substrate and the sealing member to each other, a plurality of conductive wires formed on the display substrate while being overlapped with the sealant, and a short-circuit blocking layer formed between the plurality of conductive wires.

The short-circuit blocking layer may be overlapped with the sealant.

A plurality of short-circuit blocking layers may be formed in the length direction of the sealant.

At least one of the short-circuit blocking layers may be positioned between every two adjacent conductive wires, the short-circuit blocking layer being spaced apart from the conductive wires along the length direction of the sealant.

The short-circuit blocking layer may have a rectangular shape or a circular shape on a plan.

The short-circuit blocking layer may be separated into a plurality of sub-short-circuit layers in the width direction of the sealant.

The sub-short-circuit blocking layer may have the rectangular shape or an angular shape in which a corner portion is concaved on the plan.

The short-circuit blocking layer may be a double layer including a lower blocking layer and an upper blocking layer.

The lower blocking layer may be between the upper blocking layer and the display substrate, the upper blocking layer covering the lower blocking layer The conductive wire may include at least one metal selected from aluminum (Al), chromium (Cr), molybdenum (Mo), titanium (Ti), tantalum (Ta), Al—Ni—La alloy, and Al—Nd alloy.

The lower blocking layer may be made of the same material as the conductive wire.

The organic light emitting diode display may further include a thin film transistor disposed in a display area of the display substrate and a driving circuit chip disposed on the edge of the display substrate to transmit a driving signal to the thin film transistor. The conductive wire may electrically connect the driving circuit chip with the thin film transistor.

The organic light emitting diode display may further include an organic light emitting diode including a first electrode formed on the thin film transistor, an organic emission layer formed on the first electrode, and a second electrode formed on the organic emission layer.

The short-circuit blocking layer may be a single layer and the single layer may be made of the same material as the first electrode.

The upper blocking layer may be made of the same material as the first electrode.

At least a portion of the short-circuit blocking layer may include a different material than the conductive wires.

The short-circuit blocking layer and the conductive wires may be directly on a substantially same plan.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
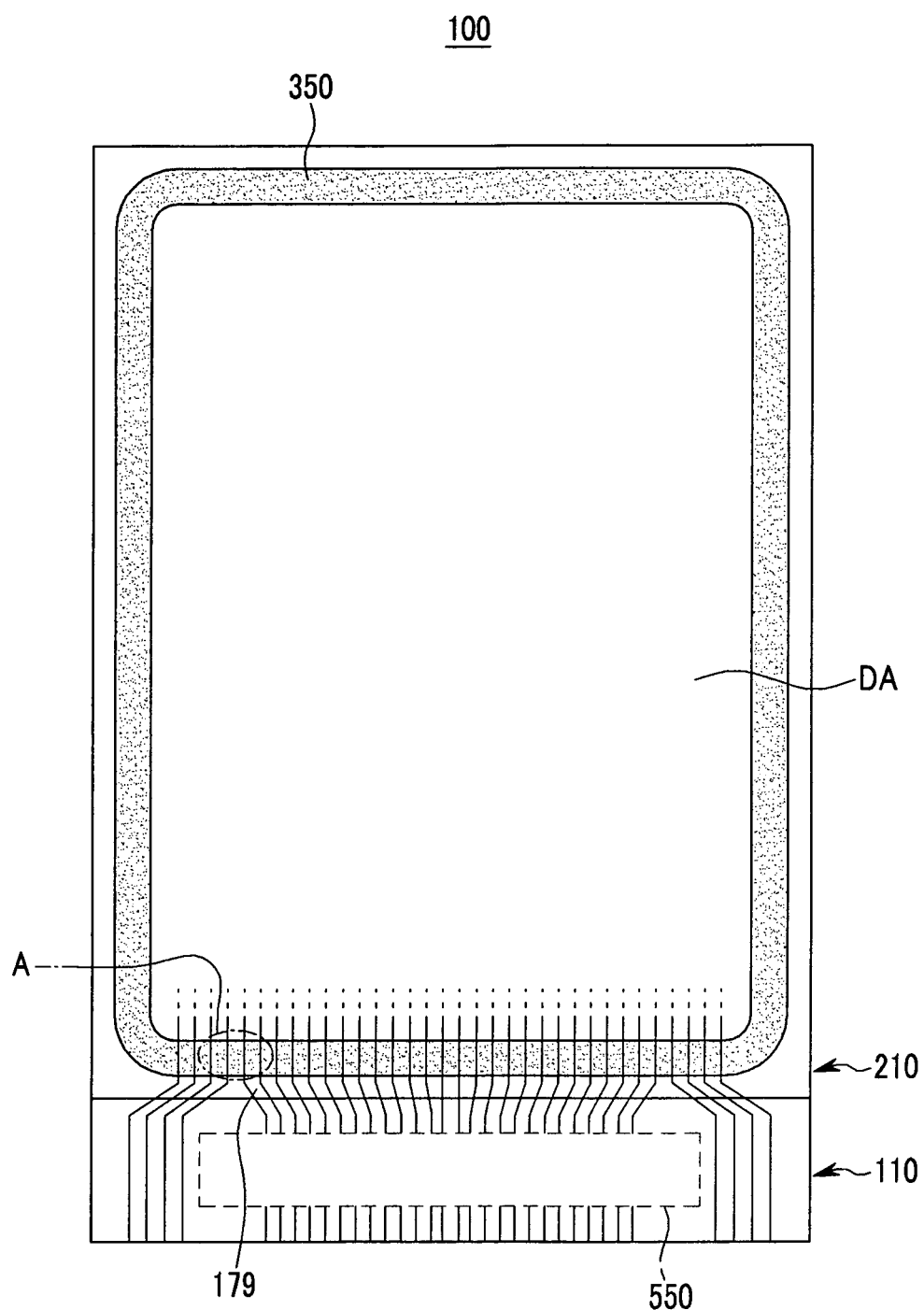
FIG. 1 illustrates a plan view of an organic light emitting diode display according to a first embodiment.

Korean Patent Application No. 10-2010-0005546, filed on Jan. 21, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer or element is referred to as being "on" another layer or element, it can be directly on the other layer or element, or intervening layers/elements may also be present. In addition, it will also be understood that when an element is referred to as being "between" two elements, it can be the only element between the two elements, or one or more intervening elements may also be present. Like reference numerals refer to like elements throughout.

Further, in the accompanying drawings, although an active matrix (AM) type organic light emitting diode display having a 2Tr-1Cap structure, which is provided with two thin film transistors (TFTs) and one storage capacitor in one pixel, is shown, exemplary embodiments are not limited thereto. Accordingly, the organic light emitting diode display may be provided with three or more TFTs and two or more storage capacitors in one pixel and may be configured to have various structures with additional wires. Herein, the pixel represents a minimum unit displaying an image, and the organic light emitting diode display displays the image by means of a plurality of pixels.

Figure 2:
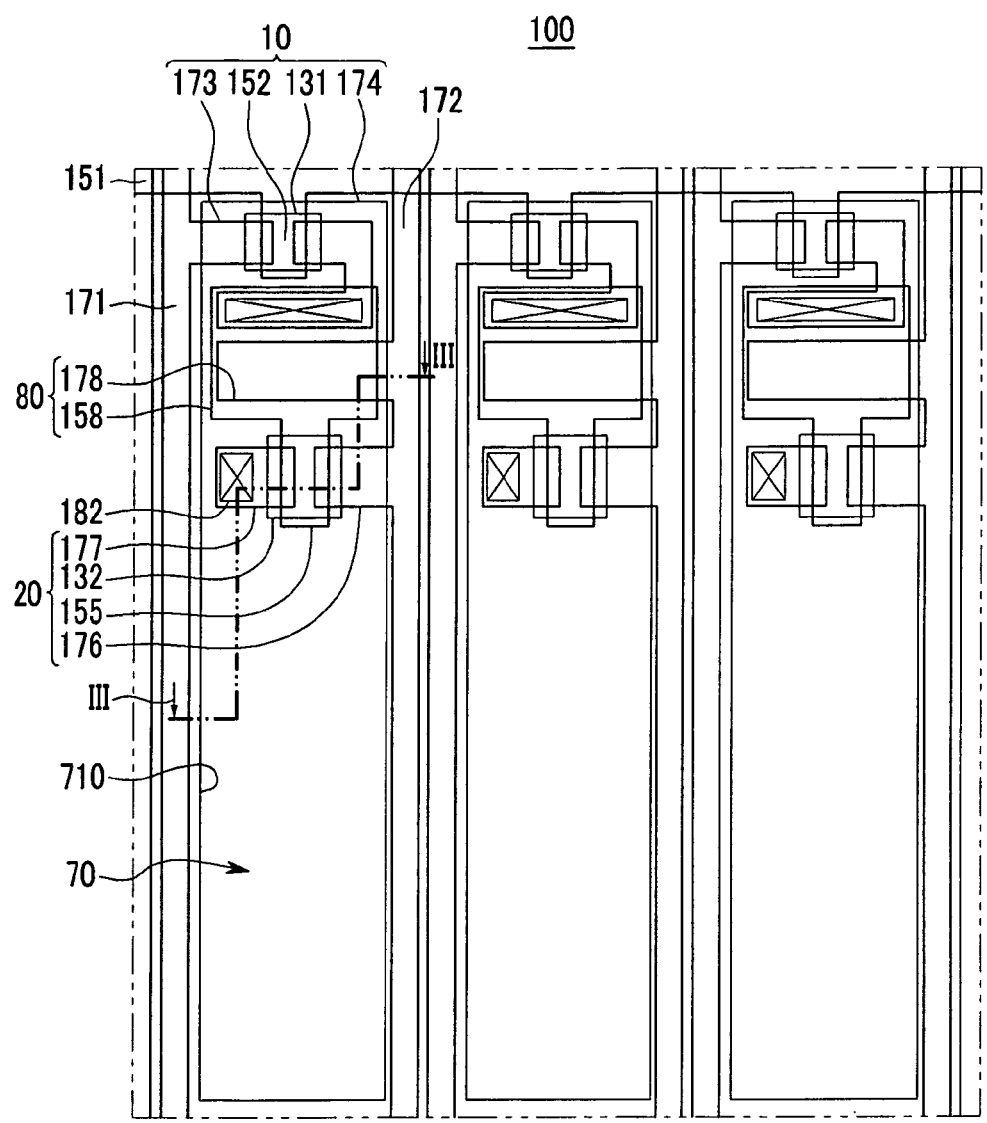
FIG. 2 illustrates a partially enlarged layout view of a display area in FIG. 1.
Figure 3:
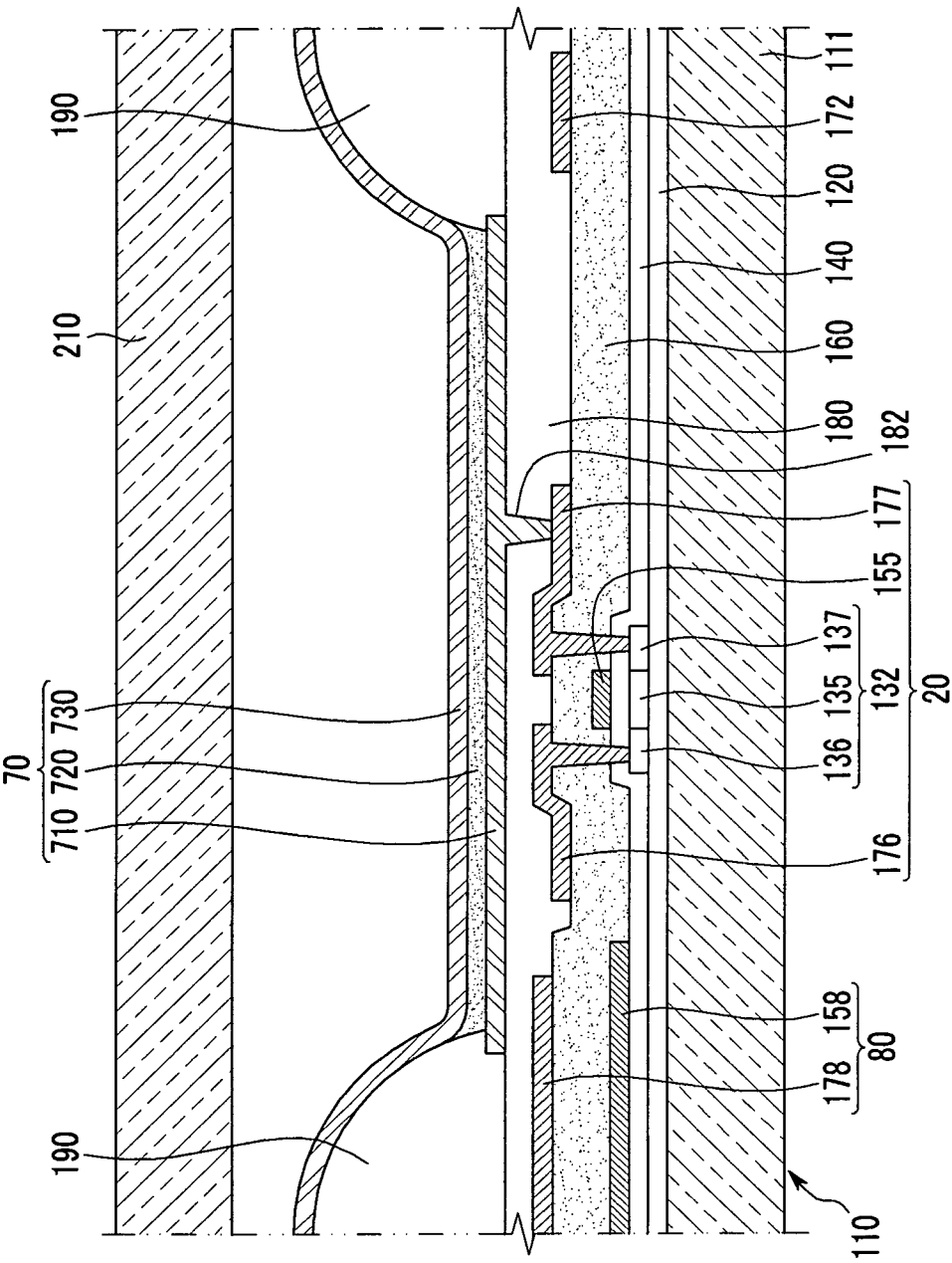
FIG. 3 illustrates a cross-sectional view taken along line of FIG. 2.
Figure 4:
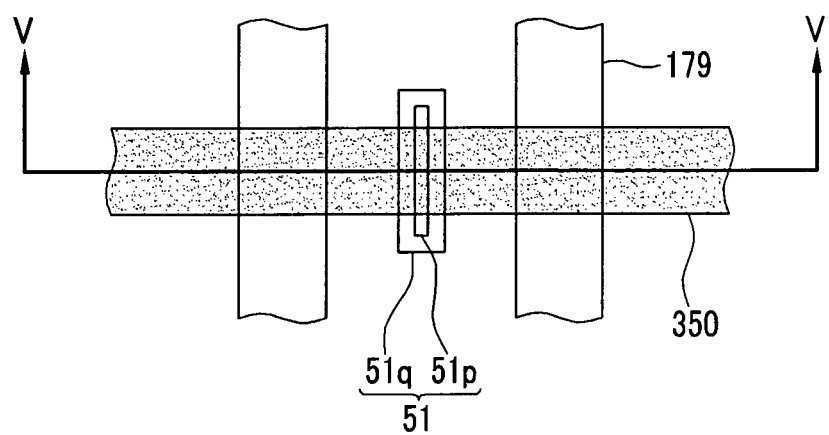
FIG. 4 illustrates an enlarged schematic view of conductive wires in FIG. 1.
Figure 5:
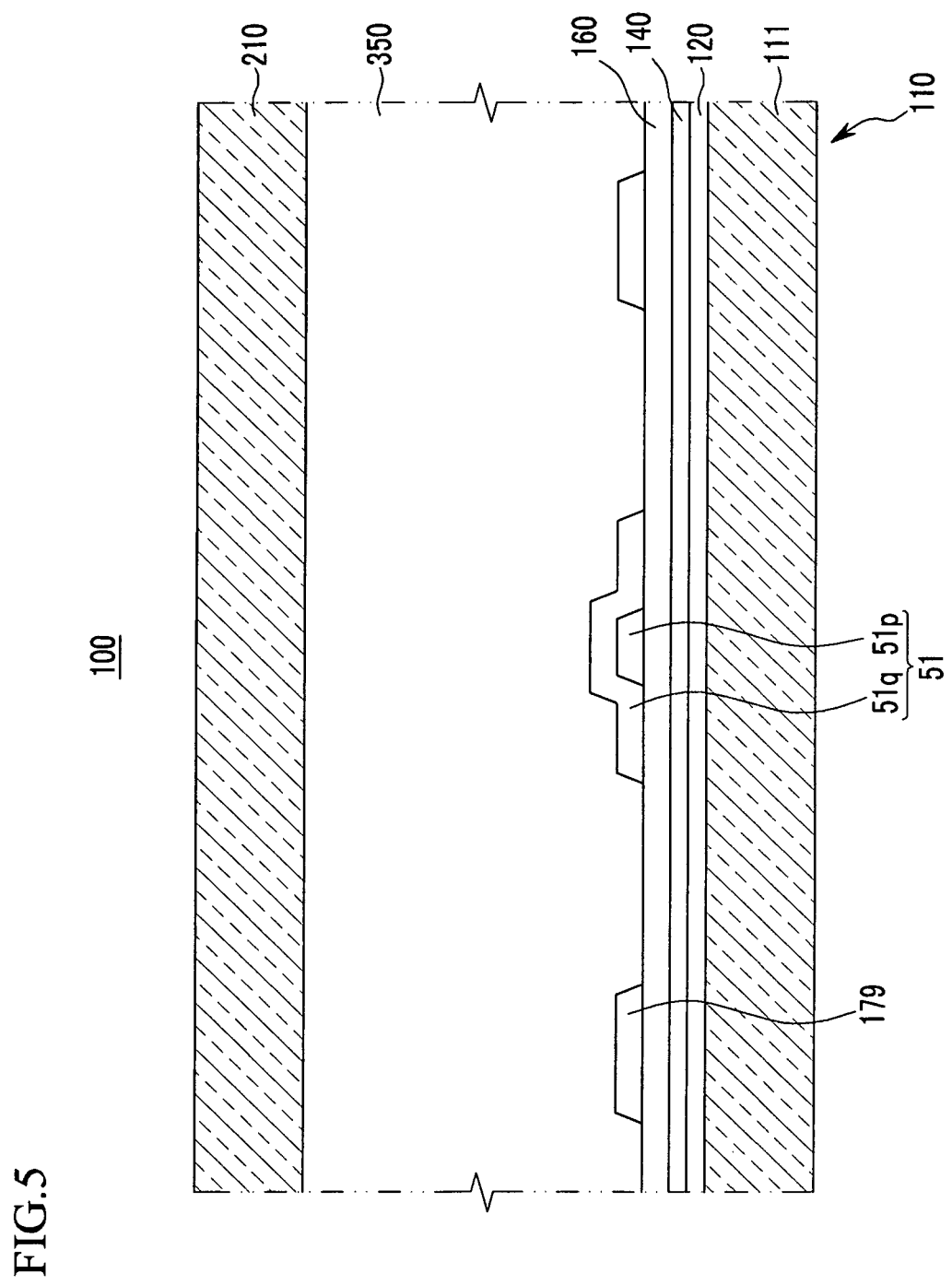
FIG. 5 illustrates a cross-sectional view taken along line V-V of FIG. 4.

Hereinafter, a first embodiment will be described with reference to FIGS. 1-5. FIG. 1 illustrates a plan view of an organic light emitting diode display according to a first embodiment, FIG. 2 illustrates a partially enlarged layout view of a display area of FIG. 1, FIG. 3 illustrates a cross-sectional view taken along line of FIG. 2, and FIGS. 4-5 illustrate enlarged plan and sectional views of conductive wires in the organic light emitting diode display of FIG. 1.

As shown in FIG. 1, the organic light emitting diode display 100 according to the first embodiment may include a display substrate 110, a sealing member 210 covering the display substrate 110, and a sealant 350 disposed between the display substrate 110 and the sealing member 210. Further, a plurality of conductive wires 179 may be formed on an edge of the display substrate 110.

The sealant 350 may be disposed on the edge of the sealing member 210, and may attach and seal the display substrate 110 and the sealing member 210 to each other. Hereinafter, an inner part between the display substrate 110 and the sealing member 210, i.e., a region surrounded by the sealant 350, is referred to as a display area DA. A plurality of pixels may be formed in the display area DA to display an image.

The sealing member 210 may be smaller than the display substrate 110. In addition, a driving circuit chip 550 may be mounted on one edge of the display substrate 110 that is not covered by the sealing member 210.

The conductive wires 179 may electrically connect elements formed in a space sealed by the sealant 300 and the driving circuit chip 550. Some of the plurality of conductive wires 179 may be electrically connected with a printed circuit board (not shown). As a result, some of the conductive wires 179 may overlap with the sealant 350. That is, the conductive wires 179 may extend from the display area DA to an area external to the sealant 350, e.g., the driving circuit chip 550, thereby crossing over and overlapping a portion of the sealant 350. The conductive wires 179 will be described in more detail below with reference to FIGS. 4-5.

Hereinafter, an internal structure of the organic light emitting diode display 100, e.g., pixels formed in the display area DA, will be described with reference to FIGS. 2 and 3.

As shown in FIGS. 2 and 3, the display substrate 110 may include a switching thin film transistor 10, a driving thin film transistor 20, a storage capacitor 80, and an organic light emitting diode (OLED) 70 that are formed for each pixel. The display substrate 110 may further include a gate line 151 disposed in one direction, and a data line 171 and a common power supply line 172 that are insulated from and cross the gate line 151. A boundary of one pixel may be defined by the gate line 151, the data line 171, and the common power supply line 172, but is not necessarily limited thereto.

The OLED 70 may include a first electrode 710, an organic emission layer 720 formed on the first electrode 710, and a second electrode 730 formed on the organic emission layer 720. Herein, the first electrode 710 is a positive (+) electrode which is a hole injection electrode, and the second electrode 730 is a negative (−) electrode which is an electron injection electrode. However, the first embodiment is not necessarily limited thereto. Therefore, the first electrode 710 may be the negative electrode, and the second electrode 730 may be the positive electrode according to a driving method of the organic light emitting diode display 100. Holes and electrodes are injected into the organic emission layer 720 from each of the first electrode 710 and the second electrode 730. When excitons generated by combination of the injected holes and electrons are transitioned from an excited state to a ground state, light is emitted.

The storage capacitor 80 may include a first storage plate 158 and a second storage plate 178 with an interlayer insulating layer 160 interposed therebetween. The interlayer insulating layer 160 is a dielectric. Storage capacity is determined by electric charges stored in the storage capacitor 80 and a voltage between the first and second storage plates 158 and 178.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177.

The switching thin film transistor 10 may be used as a switching element selecting a pixel to emit light. The switching gate electrode 152 may be connected to the gate line 151. The switching source electrode 173 may be connected to the data line 171. The switching drain electrode 174 may be disposed spaced from the switching source electrode 173 and connected to the first storage plate 158.

The driving thin film transistor 20 applies a driving power for allowing the organic emission layer 720 of the OLED 70 in the selected pixel to emit light to the pixel electrode 710. The driving gate electrode 155 may be connected to the first storage plate 158. Each of the driving source electrode 176 and the second storage plate 178 may be connected to the common power supply line 172. The driving drain electrode 177 may be connected to the first electrode 710 of the OLED 70 through an electrode contact hole 182.

By this structure, the switching thin film transistor 10 is operated by a gate voltage applied to the gate line 151 to transmit a data voltage applied to the data line 171 to the driving thin film transistor 20. A voltage equivalent to a difference between a common voltage applied to the driving thin film transistor 20 from the common power supply line 172 and the data voltage transmitted from the switching thin film transistor 10 is stored in the storage capacitor 80, and a current corresponding to the voltage stored in the storage capacitor 80 flows to the OLED 70 through the driving thin film transistor 20 to allow the OLED 70 to emit light.

Hereinafter, the structure of the organic light emitting diode display 100 according to the first embodiment will be described in detail in accordance with a lamination sequence. Further, the structure of a thin film transistor will now be described with reference to the driving thin film transistor 20. In addition, only a difference between the switching thin film transistor 10 and the driving thin film transistor 20 will be described in brief.

Referring to FIG. 3, the display substrate 110 may include a first substrate member 111 formed of an insulating substrate, e.g., made of glass, quartz, ceramic, plastic, etc. However, the example embodiments are not limited thereto, e.g., the first substrate member 111 may be formed of a metallic substrate, e.g., made of stainless steel, etc.

A buffer layer 120 may be formed on the first substrate member 111. The buffer layer 120 may prevent impurities from permeating into the first substrate member 111 and may flatten an upper surface of the first substrate member 111. The buffer layer 120 may be made of various materials that may perform the above functions, e.g., one or more of a silicon nitride ($SiN_x$) film, a silicon oxide ($SiO_2$) film, and a silicon oxy-nitride ($SiO_xN_y$). However, the buffer layer 120 is not necessarily required and may be omitted depending on the kind of the first substrate member 111 and a process condition.

The driving semiconductor layer 132 may be formed on the buffer layer 120. The driving semiconductor layer 132 may be made of, e.g., a polycrystalline silicon film. The driving semiconductor layer 132 may include a channel region 135 that is not doped with impurities, and a source region 136 and a drain region 137 that are doped with p+ impurities, e.g., ions of boron and $B_2H_6$, at both sides of the channel region 135. The impurity depends on the kind of the thin film transistor.

It is noted that a PMOS-structure thin film transistor using p-type impurities may be used as the driving thin film transistor 20. However, the driving thin film transistor 20 is not limited thereto, e.g., an NMOS-structure thin film transistor and/or a CMOS-structure thin film transistor may be used as the driving thin film transistor 20. It is further noted that while the driving thin film transistor 20 is described as a polycrystalline thin film transistor including a polycrystalline silicon film, the switching thin film transistor 10 may be a polycrystalline thin film transistor or an amorphous thin film transistor including an amorphous silicon film.

A gate insulating layer 140, e.g., that is made of silicon nitride ($SiN_x$) or silicon oxide ($SiO_2$), may be formed on the driving semiconductor layer 132. A gate wire including the driving gate electrode 155 may be formed on the gate insulating layer 140. Further, the gate wire may include the gate line 151, the first storage plate 158, and other wires. In addition, the driving gate electrode 155 may overlap with at least a part of the driving semiconductor layer 132, e.g., with the channel region 135.

An interlayer insulating layer 160 covering the driving gate electrode 155 may be formed on the gate insulating layer 140. The gate insulating layer 140 and the interlayer insulating layer 160 may share through-holes for exposing the source region 136 and the drain region 137 of the driving semiconductor layer 132. The interlayer insulating layer 160 may be made of a ceramic-based material, e.g., silicon nitride ($SiN_x$) or silicon oxide ($SiO_2$), like the gate insulating layer 140.

A data wire including the driving source electrode 176 and the driving drain electrode 177 may be formed on the interlayer insulating layer 160. Further, the data wire may include the data line 171, the common power supply line 172, the second storage plate 178, and other wires. In addition, the driving source electrode 176 and the driving drain electrode 177 may be connected with the source region 136 and the drain region 137 of the driving semiconductor layer 132 through the through-holes formed on the interlayer insulating layer 160 and the gate insulating layer 140, respectively.

As such, the driving thin film transistor 20 may be formed to include the driving semiconductor layer 132, the driving gate electrode 155, the driving source electrode 176, and the driving drain electrode 177. The configuration of the driving thin film transistor 20 is not limited to the above-mentioned example, but may be modified in various known configurations that can easily be implemented by those skilled in the art.

A planarization layer 180 covering the data wires 172, 176, 177, and 178 may be formed on the interlayer insulating layer 160. The planarization layer 180 serves to remove a step and provide a planarized layer in order to increase the luminous efficiency of the OLED 70 to be formed thereon. Further, the planarization layer 180 may have the electrode contact hole 182 for exposing a part of the drain electrode 177. The planarization layer 180 may be made of at least one of polyacrylate resin, epoxy resin, phenolic resin, polyamide resin, polyimide rein, unsaturated polyester resin, poly phenylenether resin, poly phenylenesulfide resin, and benzocyclobutene (BCB). It is noted that any one of the planarization layer 180 and the interlayer insulating layer 160 may be omitted if needed.

The first electrode 710 of the OLED 70 may be formed on the planarization layer 180. That is, the organic light emitting diode display 100 may include a plurality of first electrodes 710 that are disposed in each of the plurality of pixels. The plurality of first electrodes 710 may be spaced apart from each other. The first electrode 710 may be connected with the drain electrode 177 through the electrode contact hole 182 of the planarization layer 180.

Further, a pixel defined layer 190 including an opening for exposing the first electrode 710 may be formed on the planarization layer 180. That is, the pixel defined layer 190 may have a plurality of openings formed in each pixel. In addition, the first electrode 710 may be disposed to correspond to the opening of the pixel defined layer 190. However, the first electrode 710 is not necessarily disposed only in the opening of the pixel defined layer 190, but the pixel electrode 710 may be disposed below the pixel defined layer 190 so that a part of the pixel electrode 710 is overlapped with the pixel defined layer 190. The pixel defined layer 190 may be made of, e.g., polyacrylate resin, polyimide resin, or silica-based inorganic materials.

The organic emission layer 720 may be formed on the first electrode 710, and the second electrode 730 may be formed on the organic emission layer 720. As such, the OLED 70 may be formed to include the first electrode 710, the organic emission layer 720, and the second electrode 730.

The organic emission layer 720 may be made of a low molecular organic material or a high molecular organic material. Further, the organic emission layer 720 may be formed by a multilayer including at least one of an emission layer, a hole-injection layer (HIL), a hole-transporting layer (HTL), an electron-transporting layer (ETL), and an electron-injection layer (EIL). In the case in which the multilayer includes all of the above layers, the HIL may be disposed on the positive first electrode 710, and the HTL, the emission layer, the ETL, and the EIL may be laminated thereon in sequence.

Further, the organic emission layer 720 may be disposed in the opening of the pixel defined layer 190, as illustrated in FIG. 3. However, embodiments are not limited thereto. Accordingly, the organic emission layer 720 may be formed on the first electrode 710 in the opening of the pixel defined layer 190 and may be disposed between the pixel defined layer 190 and the second electrode 730. Specifically, the organic emission layer 720 may further include various layers, e.g., the HIL, the HTL, the ETL, the EIL, and/or the emission layer. At this time, the HIL, the HTL, the ETL, and the EIL other than the emission layer may be formed on the pixel defined layer 190 in addition to the first electrode 710 like the second electrode 730 by using an open mask while manufacturing the layers. That is, at least one of the various layers included in the organic emission layer 720 may be disposed between the pixel defined layer 190 and the second electrode 730.

Each of the first electrode 710 and the second electrode 730 may be made of a transparent conductive material or a semi-transparent or reflective conductive material. The organic light emitting diode display 100 may be a top emission type, a bottom emission type, or a double surface emission type according to the kind of the material of which the first electrode 710 and the second electrode 730 are made.

Materials such as indium tin oxide (ITO), indium zinc oxide (IZO), zinc oxide (ZnO), or indium oxide ($In_2O_3$) may be used as the transparent conductive material in the first electrode 710 and the second electrode 730. Materials such as lithium (Li), calcium (Ca), fluorinated lithium/calcium (LiF/Ca), fluorinated lithium/aluminum (LiF/Al), aluminum (Al), silver (Ag), magnesium (Mg), or gold (Au) may be used as the reflective material and the semi-transparent material in the first electrode 710 and the second electrode 730.

The sealing member 210 may be disposed on the second electrode 730 to face the display substrate 110. The sealing member 210 may be made of a transparent material, e.g., glass or plastic. The sealing member 210 may be attached and sealed to the display substrate 110 through the sealant 350 on the edge thereof.

Hereinafter, the conductive wires 179 of the organic light emitting diode display 100 will be described with reference to FIGS. 4 to 5. FIG. 4 illustrates an enlarged diagram of part A of the organic light emitting diode display 100 shown in FIG. 1, and FIG. 5 illustrates a cross-sectional view taken along line V-V of FIG. 4.

Referring to FIGS. 4 and 5, the buffer layer 120 may be formed on the display substrate 111, e.g., on the entire display substrate 111, so the buffer layer 120 may be positioned inside and outside the display area DA. The gate insulating layer 140 may be formed on the buffer layer 120, and the interlayer insulating layer 160 may be formed on the gate insulating layer 140. For example, outside of the display area DA, the gate insulating layer 140 and the interlayer insulating layer 160 may be formed sequentially on the buffer layer 120. As illustrated in FIG. 5, the plurality of conductive wires 179 may be formed on, e.g., directly on, the interlayer insulating layer 160. Therefore, the conductive wires 179 may extend on, e.g., directly on, the interlayer insulating layer 160 from the display area DA to an area external to the display area DA. The sealant 350 may be formed on the conductive wires 179, e.g., between the conductive wires 179 and the sealing member 210.

As further illustrated in FIGS. 4-5, a short-circuit blocking layer 51 may be formed on, e.g., directly on, the interlayer insulating layer 160. The short-circuit blocking layer 51 may be formed between the plurality of the conductive wires 179, and may have a rectangular shape as viewed from a plan view. The short-circuit blocking layer 51 may overlap the sealant 350, e.g., the short-circuit blocking layer 51 may extend along an entire width direction of the sealant 350. For example, the short-circuit blocking layer 51 and the conductive wires 179 may be formed on a substantially same plane, e.g., the short-circuit blocking layer 51 and the conductive wires 179 may be formed directly on the interlayer insulating layer 160, so bottom surfaces, i.e., surfaces facing the display substrate 111, of the short-circuit blocking layer 51 and the conductive wires 179 may be substantially coplanar. For example, the short-circuit blocking layer 51 and the conductive wires 179 may be spaced apart from each other along a horizontal direction, i.e., a length direction of the sealant 350 substantially perpendicular to the width direction of the sealant 350.

Further, as illustrated in FIGS. 4-5, the short-circuit blocking layer 51 may have a double-layered structure including a lower blocking layer 51p and an upper blocking layer 51q. The lower blocking layer 51p may be on, e.g., directly on, the interlayer insulating layer 160. The upper blocking layer 51q may be on, e.g., directly on, the interlayer insulating layer 160, and may cover, e.g., completely cover, the lower blocking layer 51p. For example, the upper blocking layer 51q may overlap all exposed surfaces of the lower blocking layer 51p, so the lower blocking layer 51p may be enclosed, e.g., sealed, between the upper blocking layer 51q and the interlayer insulating layer 160. For example, a width and a length of the upper blocking layer 51q may be larger than those of the lower blocking layer 51p, so portions of the upper blocking layer 51q may extend horizontally on, e.g., directly on, the interlayer insulating layer 160 to a predetermined distance, thereby ensuring proper sealing of the lower blocking layer 51p.

The conductive wires 179 may be made of the same material as and through the same manufacturing process as the switching source/drain electrode 173/174 of the switching thin film transistor 10 and the driving source/drain electrode 176/177 of the driving thin film transistor 20 in the display area DA. That is, the conductive wires 179 may be made of a material including at least one metal, e.g., one or more of aluminum (Al), chromium (Cr), molybdenum (Mo), titanium (Ti), tantalum (Ta), Al—Ni—La alloy, and Al—Nd alloy.

The lower blocking layer 51p may be made of the same material and through the same process as the conductive wires 179. For example, a single process may be used to form the lower blocking layer 51p and the conductive wires 179 simultaneously on the interlayer insulating layer 160 of the same material. The upper blocking layer 51q may be made of the same material and through the same process as the first electrode 710, e.g., of a transparent conductive material or a semi-transparent or reflective conductive material.

Therefore, when the sealant 350 is hardened, e.g., heated via a laser irradiation, even if the conductive wires 179 overlapping the sealant 350 are melted due to the heat, the short-circuit blocking layer 51 between the conductive wires 179 may prevent the melted conductive wires 179 from contacting each other. In particular, as the short-circuit blocking layer 51 has a double-layered structure composed of the lower blocking layer 51p and the upper blocking layer 51q between the conductive wires 179, the melted conductive wires 179 may not be attached to each other over the short-circuit blocking layer 51. As such, a short circuit may be prevented.

The sealing member 210 may be attached onto the sealant 350, and the sealant 350 may be made of a ceramic-based material, e.g., frit. Specifically, one portion of the sealant 350 may be in contact with the sealing member 210, and another portion of the sealant 350 may be in contact with the interlayer insulating layer 160 of a part where the conductive wire 179 and the short-circuit blocking layer 51 are not formed. As a result, the sealant 350 may attach and seal the sealing member 210 and the display substrate 110 to each other.

Although a single short-circuit blocking layer 51 may be formed between the conductive wires 179, e.g., between every two adjacent conductive wires 179, in the first embodiment, a plurality of short-circuit blocking layers may also be formed. Hereinafter, a second embodiment, in which a plurality of short-circuit blocking layers are formed between the conductive wires 179, will be described.

Figure 6:
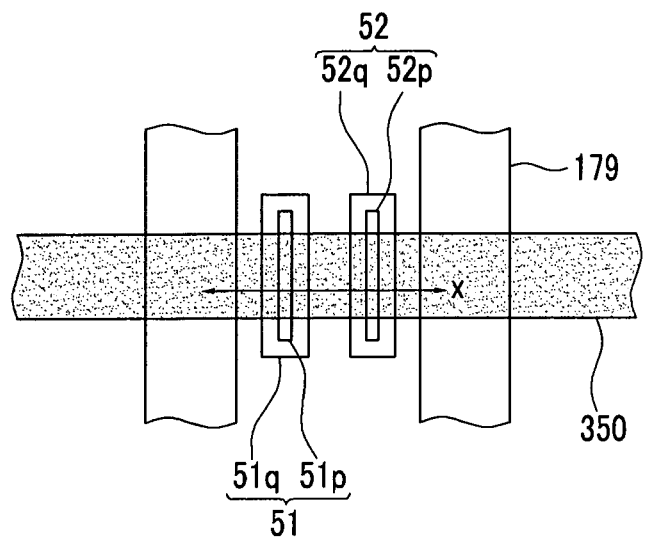
FIG. 6 illustrates a partially enlarged schematic view of conductive wires in an organic light emitting diode display according to a second embodiment.

Referring to FIG. 6, in the organic light emitting diode display 100 according to the second embodiment, a plurality of short-circuit blocking layers, e.g., first and second short-circuit blocking layers 51 and 52, may be formed between the conductive wires 179 in the length direction X of the sealant 350. It is noted that the first short-circuit blocking layer 51 was described previously with reference to FIGS. 4-5, and the second short-circuit blocking layer 52 may have a substantially same structure and configuration as the first short-circuit blocking layer 51. For example, the first and second short-circuit blocking layers 51 and 52 may have a rectangular shape as viewed from a plan view, and the first and second short-circuit blocking layers 51 and 52 may be spaced apart from each other by a predetermined interval along the X direction. As such, forming the plurality of short-circuit blocking layers 51 and 52 may effectively prevent melted conductive wires 179 from contacting each other over the short-circuit blocking layers 51 and 52.

The short-circuit blocking layers 51 and 52 may include lower blocking layers 51p and 52p and upper blocking layers 51q and 52q, respectively. At this time, the upper blocking layers 51q and 52q may fully cover the lower blocking layers 51p and 52p, respectively.

Although the short-circuit blocking layer 51 in the first embodiment has a double-layered structure, a short-circuit blocking layer may have a single-layered structure. Hereinafter, a third embodiment, in which a short-circuit blocking layer has a single-layered structure, will be described with reference to FIG. 7.

Figure 7:
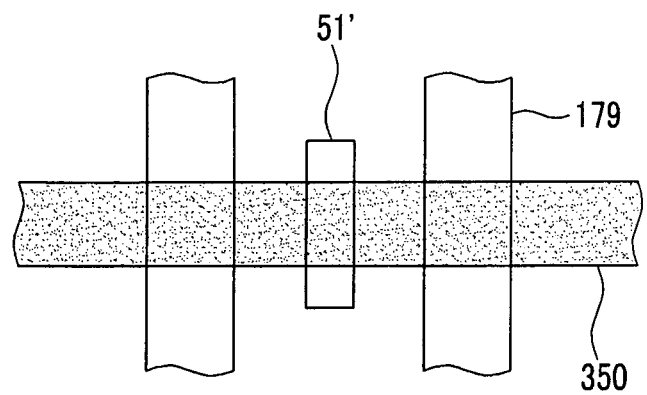
FIG. 7 illustrates a partially enlarged schematic view of conductive wires in an organic light emitting diode display according to a third embodiment.

Referring to FIG. 7, in the organic light emitting diode display 100 according to the third embodiment, a short-circuit blocking layer 51' made of the same material as the first electrode 710 may be formed between the conductive wires 179. In other words, the short-circuit blocking layer 51' may have a substantially same structure and configuration as the short-circuit blocking layer 51 with respect to the conductive wires 179 described previously with reference to FIGS. 4-5, with the exception of having only the lower blocking layer, i.e., not having the upper blocking layer.

Figure 8:
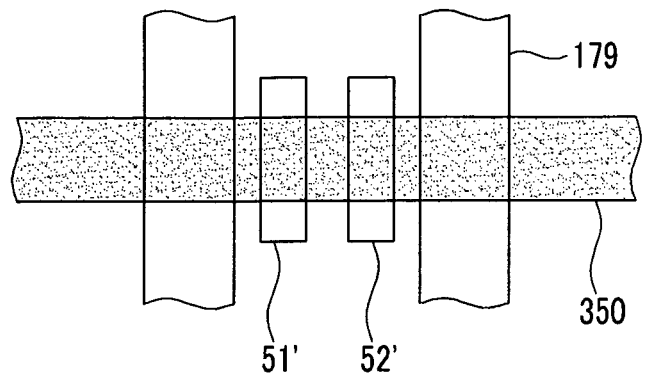
FIG. 8 illustrates a partially enlarged schematic view of conductive wires in an organic light emitting diode display according to a fourth embodiment.

Hereinafter, a fourth embodiment will be described with reference to FIG. 8. As shown in FIG. 8, in the organic light emitting diode display 100 according to the fourth embodiment, a plurality of short-circuit blocking layers, e.g., first and second short-circuit blocking layers 51' and 52', may be formed between the conductive wires 179 in the length direction X of the sealant 350. At this time, the plurality of short-circuit blocking layers 51' and 52' may be formed between the conductive wires 179 while being made of the same material as the first electrode 710.

The plurality of short-circuit blocking layers 51' and 52' may have a rectangular shape as viewed from a plan view, and the first and second short-circuit blocking layers 51' and 52' may be spaced apart from each other by a predetermined interval. As such, forming the plurality of short-circuit blocking layers 51' and 52' may effectively prevent the melted conductive wires 179 from being attached to each other over the short-circuit blocking layers 51' and 52'.

Although the short-circuit blocking layer of the first to fourth embodiment have a rectangular shape, the short-circuit blocking layers may be formed in various shapes. Hereinafter, a fifth embodiment, in which the short-circuit blocking layers have non-rectangular shape, will be described with reference to FIG. 9.

Figure 9:
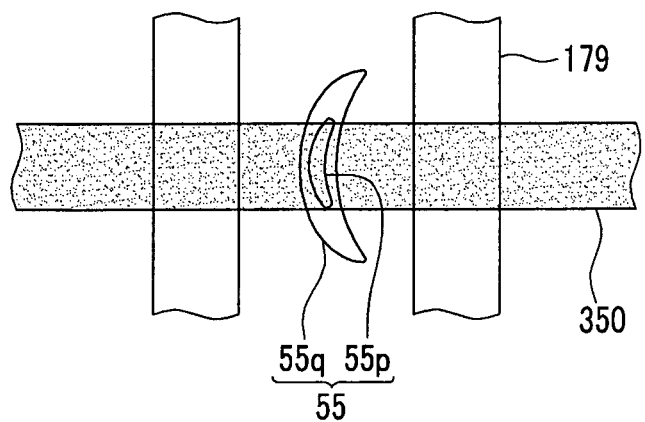
FIG. 9 illustrates a partially enlarged schematic view of conductive wires in an organic light emitting diode display according to a fifth embodiment.

Referring to FIG. 9, in the organic light emitting diode display 100 according to the fifth embodiment, a short-circuit blocking layer 55 may have a shape of a circular arc, e.g., a crescent shape, as viewed from a plan view. It may be possible to effectively prevent the melted conductive wires 179 from being attached to each other over the short-circuit layer 55 by forming the short-circuit layer 55 having the circular arc to increase a contact area with the melted conductive wires 179. Further, the short-circuit blocking layer 55 may have a double-layered structure including a lower blocking layer 55p and an upper blocking layer 55q. At this time, the upper blocking layer 55q may fully cover the lower blocking layer 55p.

Although a single circular short-circuit blocking layer 55 has been described between the conductive wires 179 in the fifth embodiment, plural short-circuit blocking layers may also be formed. Hereinafter, a sixth embodiment, in which a plurality of short-circuit blocking layers are formed, will be described with reference to FIG. 10.

Figure 10:
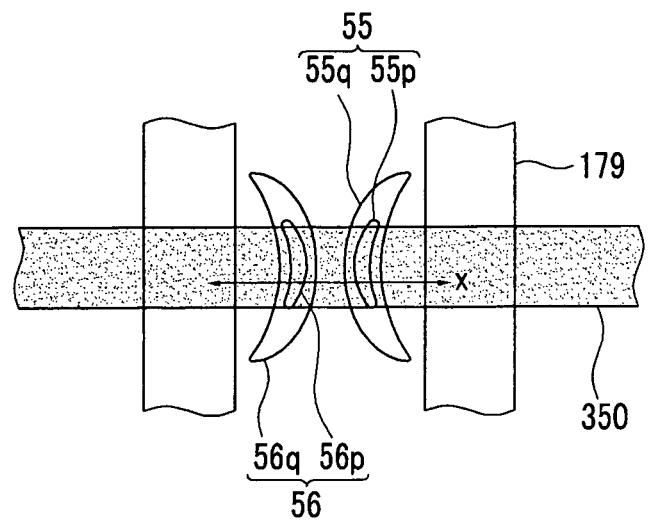
FIG. 10 illustrates a partially enlarged schematic view of conductive wires in an organic light emitting diode display according to a sixth embodiment.

Referring to FIG. 10, in the organic light emitting diode display 100 according to the sixth embodiment, a plurality of short-circuit blocking layers, e.g., first and second short-circuit blocking layers 55 and 56, may be formed between the conductive wires 179 in the length direction X of the sealant 350. The plurality of short-circuit blocking layers 55 and 56 may be crescent-shaped, as described previously with reference to FIG. 9. The short-circuit blocking layers 55 and 56 may be spaced apart from each other by a predetermined interval. Herein, the plurality of short-circuit blocking layers 55 and 56 may be disposed to face each other at their respective convex portions.

As such, forming the plurality of short-circuit blocking layers 55 and 56 may effectively prevent the conductive wires 179 melted by radiating the laser from being attached to each other over the short-circuit blocking layers 55 and 56. The short-circuit blocking layers 55 and 56 may include lower blocking layers 55*p* and 56*p* and upper blocking layers 55*q* and 56*q*, respectively. At this time, the upper blocking layers 55*q* and 56*q* may fully cover the lower blocking layers 55*p* and 56*p*.

Although a plurality of short-circuit blocking layers were described as being formed between the conductive wires 179 along the length direction X of the sealant, a plurality of short-circuit blocking layers may be formed between the conductive wires 179 along a direction perpendicular to the length direction X of the sealant. In other words, one short-circuit blocking layer may be separated into a plurality of sub-short-circuit blocking layers along a width direction of the sealant, as will be described with reference to FIG. 11.

Figure 11:
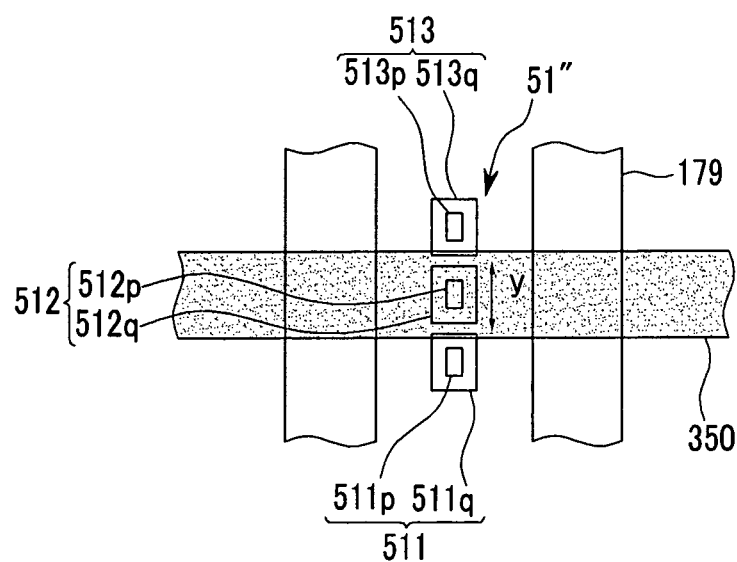
FIG. 11 illustrates a partially enlarged schematic view of conductive wires in an organic light emitting diode display according to a seventh embodiment.

Referring to FIG. 11, in the organic light emitting diode display 100 according to a seventh embodiment, a short-circuit blocking layer 51" may be formed between the conductive wires 179. The short-circuit blocking layer 51" may include a plurality of sub-short-circuit blocking layers 511, 512, and 513 along a width direction Y of the sealant 350.

The plurality, e.g., each, of the sub-short-circuit blocking layers 511, 512, and 513 may have a rectangular shape as viewed from a plan view, and the short-circuit blocking layers 511, 512, and 513 may be spaced from each other by a predetermined interval along the Y direction. As such, it may be possible to effectively prevent the melted conductive wires 179 from being attached to each other over the short-circuit blocking layer 51" by separating the short-circuit blocking layer 51" into the plurality of sub-short-circuit blocking layers 511, 512, and 513 to increase a contact area with the melted conductive wires 179.

The sub-short-circuit blocking layers 511, 512, and 513 may include lower blocking layers 511*p*, 512*p*, and 513*p* and upper blocking layers 511*q*, 512*q*, and 513*q*, respectively. At this time, the upper blocking layers 511*q*, 512*q*, and 513*q* may fully cover the lower blocking layers 511*p*, 512*p*, and 513*p*.

Although one short-circuit blocking layer 51" separated into the plurality of sub-short-circuit blocking layers 511, 512 and 513 is formed in the width direction Y of the sealant 350 in the seventh embodiment, a plurality of short-circuit blocking layers separated into a plurality of sub-short-circuit blocking layers may be formed in the width direction Y of the sealant 350. Hereinafter, an eighth embodiment, in which the plurality of short-circuit blocking layers are formed, will be described with reference to FIG. 12.

Figure 12:
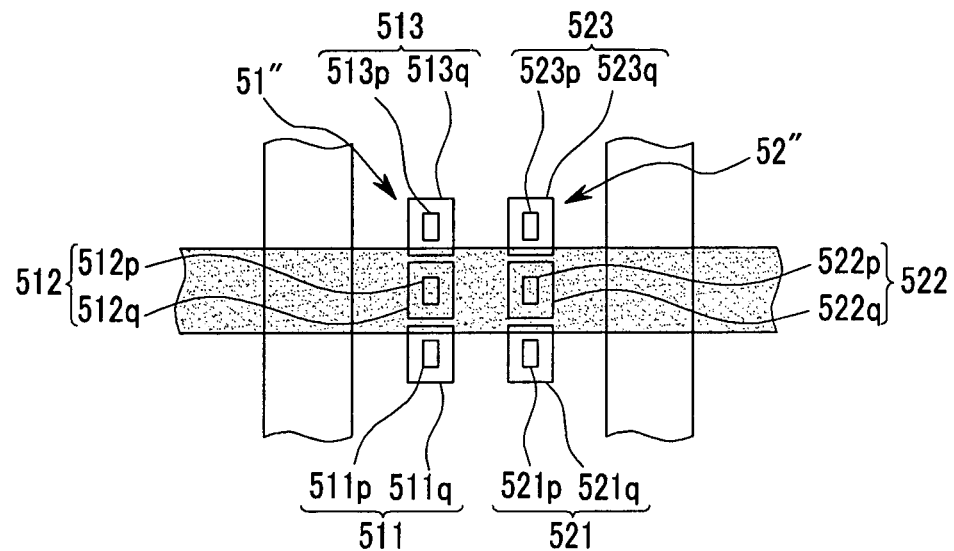
FIG. 12 illustrates a partially enlarged schematic view of conductive wires in an organic light emitting diode display according to an eighth embodiment.

Referring to FIG. 12, in the organic light emitting diode display 100 according to the eighth embodiment, the plurality of short-circuit blocking layers 51" and 52" are formed between the conductive wires 179 in the length direction X of the sealant 350. The short-circuit blocking layers 51" and 52" may be spaced from each other by a predetermined interval along the X direction. Further, each of the short-circuit blocking layers 51" and 52" may be separated into a plurality of sub-short-circuit blocking layers 511, 512, 513, 521, 522, and 523 in the width direction Y of the sealant 350.

The sub-short-circuit blocking layers 511, 512, 513, 521, 522, and 523 may have a rectangular shape as viewed from a plan view, and may be spaced from each other by a predetermined interval. As such, it may be possible to effectively prevent the melted conductive wires 179 from being attached to each other over the short-circuit blocking layers 51" and 52" by separating the short-circuit blocking layers 51" and 52" into the plurality of sub-short-circuit blocking layers 511, 512, 513, 521, 522, and 523 to increase a contact area with the melted conductive wires 179.

The sub-short-circuit blocking layers 511, 512, 513, 521, 522, and 523 may include lower blocking layers 511*p*, 512*p*, 513*p*, 521*p*, 522*p*, and 523*p* and upper blocking layers 512*q*, 512*q*, 513*q*, 521*q*, 522*q*, and 523*q*, respectively. At this time, the upper blocking layers 511*q*, 512*q*, 513*q*, 521*q*, 522*q*, and 523*q* may fully cover the lower blocking layers 511*p*, 512*p*, 513*p*, 521*p*, 522*p*, and 523*p*.

Although the short-circuit blocking layer 51" separated into the sub-short-circuit blocking layers 511, 512, and 513 has a double-layered structure, the organic light emitting diode display 100 may include a short-circuit blocking layer with a single-layered structure. Hereinafter, referring to FIG. 13, a ninth embodiment in which a short-circuit blocking layer 51*a* having a single-layered structure is formed, will be described.

Figure 13:
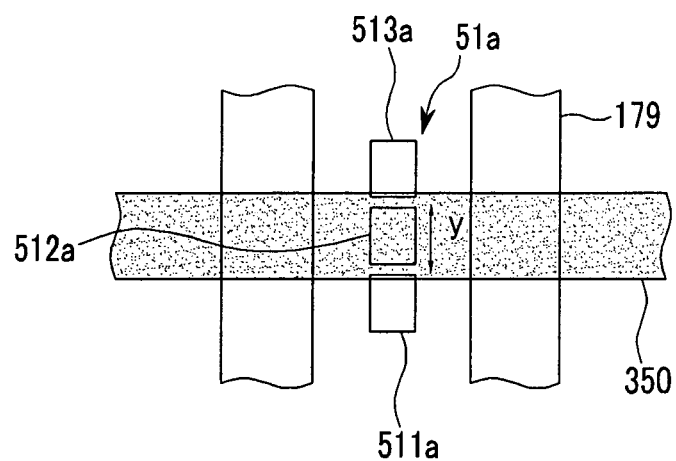
FIG. 13 illustrates a partially enlarged schematic view of conductive wires in an organic light emitting diode display according to a ninth embodiment.

Referring to FIG. 13, in the organic light emitting diode display 100 according to the ninth embodiment, the short-circuit blocking layer 51*a* made of the same material as the first electrode 710 may be formed between the conductive wires 179. The short-circuit blocking layer 51*a* may be separated into a plurality of sub-short-circuit blocking layers 511*a*, 512*a*, and 513*a* in the width direction Y of the sealant 350.

Although in the eighth embodiment the short-circuit blocking layers 51" and 52" separated into the sub-short-circuit blocking layers had a rectangular shape, the organic light emitting diode display 100 may include a short-circuit blocking layer separated into sub-short-circuit blocking layers having various shapes. Hereinafter, referring to FIG. 14, a tenth embodiment in which short-circuit blocking layers 57 and 58 separated into sub-short-circuit blocking layers 571, 572, 581, and 582 having a right-angle shape will be described.

Figure 14:
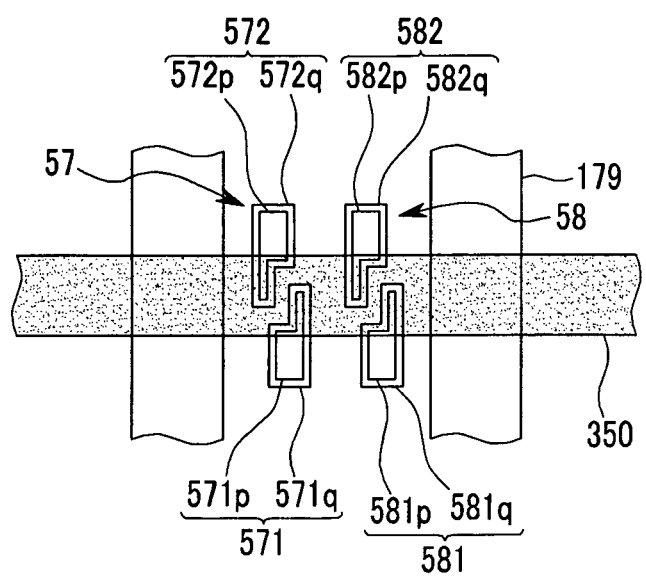
FIG. 14 illustrates a partially enlarged schematic view of conductive wires in an organic light emitting diode display according to a tenth embodiment.

Referring to FIG. 14, in the organic light emitting diode display 100 according to the tenth embodiment, the plurality of short-circuit blocking layers 57 and 58 may be formed between the conductive wires 179 in the length direction X of the sealant 350. The short-circuit blocking layers 57 and 58 may be spaced apart from each other by a predetermined interval. Further, the short-circuit blocking layers 57 and 58 may be separated into a plurality of sub-short-circuit blocking layers 571, 572, 581, and 582 in the width direction Y of the sealant 350. The sub-short-circuit blocking layers 571, 572, 581, and 582 may have an angular shape, of which a corner portion is concaved, and the sub-short-circuit blocking layers 571, 572, 581, and 582 may be spaced apart from each other by a predetermined interval. At this time, a pair of sub-short-circuit blocking layers 571 and 572 and 581 and 582 constituting the short-circuit blocking layers 57 and 58, respectively, may face each other at the concaved corner portion.

As such, it may be possible to effectively prevent the melted conductive wires 179 from being attached to each other over the short-circuit blocking layers 57 and 58 by separating the short-circuit blocking layers 57 and 58 into the plurality of sub-short-circuit blocking layers 571, 572, 581, and 582 to increase a contact area with the melted conductive wires 179. The sub-short-circuit blocking layers 571, 572, 581, and 582 include lower blocking layers 571*p*, 572*p*, 581*p*, and 582*p* and upper blocking layers 571*q*, 572*q*, 581*q*, and 582*q*, respectively. At this time, the upper blocking layers 571*q*, 572*q*, 581*q*, and 582*q* may fully cover the lower blocking layers 571*p*, 572*p*, 581*p*, and 582*p*.

According to embodiments, an organic light emitting diode display may prevent a short-circuit between adjacent conducting wires, e.g., when the conductive wires melt during laser irradiation of a sealant, via a short-circuit blocking layer between adjacent conductive wires. Further, it may be possible to effectively prevent moisture from permeating into the sealant.

In contrast, if the short-circuit blocking layer is not formed between adjacent conductive wires, the conductive wires may melt, e.g., when laser irradiation is used to harden the sealant, thereby causing a short circuit. Further, even if the conductive wires are covered with a heat resistant material, e.g., silver, to prevent melting, a part of the heat resistant material may be exposed to external moisture and to heat generated when electricity is continuously injected into the conductive wires, thereby exhibiting increased corrosion and deterioration. The increased corrosion may cause moisture permeation under the sealant and/or damage to the sealant.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
   a display substrate;
   a sealing member disposed to face the display substrate;
   a sealant disposed between the display substrate and the sealing member, the sealant to attach the display substrate and the sealing member to each other;
   a plurality of conductive wires on the display substrate, the conductive wires directly overlapping the sealant; and
   at least one short-circuit blocking layer between the conductive wires,
   wherein the short-circuit blocking layer has a double layer structure including a lower blocking layer and an upper blocking layer, the lower blocking layer and the conductive wires including substantially a same material and the upper blocking layer including a different material than the conductive wires,
   wherein the lower blocking layer and the upper blocking layer do not electrically connect to any of the conductive wires,
   wherein each of the upper blocking layer and conductive wires directly contacts the sealant, and
   wherein a total thickness of the short-circuit blocking layer is greater than a total thickness of the conductive wires, the thicknesses of the short-circuit blocking layer and the conductive wires being measured along a normal to the display substrate.

2. The organic light emitting diode display as claimed in claim 1, wherein the short-circuit blocking layer overlaps the sealant.

3. The organic light emitting diode display as claimed in claim 2, wherein each of a plurality of short-circuit blocking layers extends along a first direction to parallel the conductive wires and completely overlaps the sealant in the first direction, a longitudinal direction of the sealant being perpendicular to the first direction.

4. The organic light emitting diode display as claimed in claim 3, wherein at least one of the short-circuit blocking layers is positioned between two adjacent conductive wires, the short-circuit blocking layer being spaced apart from the conductive wires along the longitudinal direction of the sealant.

5. The organic light emitting diode display as claimed in claim 3, wherein the short-circuit blocking layers have a rectangular shape.

6. The organic light emitting diode display as claimed in claim 3, wherein the short-circuit blocking layers have a circular shape.

7. The organic light emitting diode display as claimed in claim 3, wherein each of the plurality of short circuit blocking layers includes a plurality of sub-short-circuit layers spaced apart from each other along a width direction of the sealant.

8. The organic light emitting diode display as claimed in claim 7, wherein the sub-short-circuit blocking layers have an angular shape with a concave corner portion.

9. The organic light emitting diode display as claimed in claim 1, wherein the lower blocking layer is completely enclosed between the upper blocking layer and the display substrate.

10. The organic light emitting diode display as claimed in claim 9, further comprising:
    a thin film transistor disposed in a display area of the display substrate; and
    a driving circuit chip disposed on an edge of the display substrate and configured to transmit a driving signal to the thin film transistor, the conductive wires electrically connecting the driving circuit chip with the thin film transistor.

11. The organic light emitting diode display as claimed in claim 1, wherein the lower blocking layer and the conductive wires include at least one of aluminum (Al), chromium (Cr), molybdenum (Mo), titanium (Ti), tantalum (Ta), Al—Ni—La alloy, or Al—Nd alloy.

12. The organic light emitting diode display as claimed in claim 1, further comprising an organic light emitting diode, the upper blocking layer of the short-circuit blocking layer and an electrode of the organic light emitting diode including a substantially same material.

13. The organic light emitting diode display as claimed in claim 1, wherein a distance from a bottom surface of the short-circuit blocking layer to a top surface of the display substrate equals a distance from a bottom surface of the conductive wires to the top surface of the display substrate, the bottom surfaces of the short-circuit blocking layer and conductive wires being coplanar and facing the display substrate.

14. The organic light emitting diode display as claimed in claim 1, wherein the short-circuit blocking layer includes a semiconducting material between adjacent conductive wires.

15. The organic light emitting diode display as claimed in claim 1, wherein the upper blocking layer of the short-circuit blocking layer includes a semiconducting material.

* * * * *